United States Patent [19]

Kim

[11] Patent Number: 5,405,794
[45] Date of Patent: Apr. 11, 1995

[54] METHOD OF PRODUCING VDMOS DEVICE OF INCREASED POWER DENSITY

[75] Inventor: Manjin J. Kim, Hartsdale, N.Y.

[73] Assignee: Philips Electronics North America Corporation, New York, N.Y.

[21] Appl. No.: 259,769

[22] Filed: Jun. 14, 1994

[51] Int. Cl.⁶ .......................................... H01L 21/265
[52] U.S. Cl. ...................................... 437/41; 437/67; 437/203; 148/DIG. 126; 257/332
[58] Field of Search ................... 437/41, 67, 203, 913; 148/DIG. 126; 257/330–334

[56] References Cited

U.S. PATENT DOCUMENTS

| | | |
|---|---|---|
| 4,587,713 | 5/1986 | Goodman et al. |
| 4,680,604 | 7/1987 | Nakaoquawa |
| 4,767,722 | 8/1988 | Blanchard ............................ 437/41 |
| 4,771,017 | 9/1988 | Tobin et al. |
| 4,774,198 | 9/1988 | Contiero et al. |
| 4,775,609 | 10/1988 | MacFarland |
| 4,992,390 | 2/1991 | Chang .................................. 437/42 |
| 5,017,516 | 5/1991 | van der Putten .................... 437/230 |
| 5,082,795 | 1/1992 | Temple ................................ 437/41 |
| 5,086,007 | 2/1992 | Ueno ................................... 437/41 |
| 5,122,846 | 6/1992 | Haken ................................. 357/23.4 |
| 5,202,750 | 4/1993 | Gough ................................. 257/133 |
| 5,268,586 | 12/1993 | Mukherjee et al. ................. 257/335 |
| 5,298,781 | 3/1994 | Cogan et al. ........................ 257/333 |
| 5,309,002 | 5/1994 | Terashima .......................... 257/130 |
| 5,326,711 | 7/1994 | Malhi .................................. 437/33 |

FOREIGN PATENT DOCUMENTS

| | | |
|---|---|---|
| 0336393 | 10/1993 | European Pat. Off. |
| 55-65463 | 5/1980 | Japan |
| 1-039774 | 2/1989 | Japan |
| 1-310576 | 12/1989 | Japan |

OTHER PUBLICATIONS

Wolf, S. "Silicon Processing for The VLSI Era" Lattice Press, Sunset Beach Calif., vol. 2, 1990 pp. 54–58.

H. R. Chang et al, "Insulated Gate Bipolar Transistor (IGBT) With A Trench Gate Structure", IEEE, 1987, pp. 674–IEDM 87–677–IDEM 87.

V. A. K. Temple et al, "MCT (MOS Controlled Thyristor) Reliability Investigation", IEEE, 1988, pp. 618–IEDM 88–620–IEDM 88.

Primary Examiner—George Fourson
Assistant Examiner—David Mason
Attorney, Agent, or Firm—Norman N. Spain

[57] ABSTRACT

A vertical double diffused metal-on-semiconductor device is produced by a method involving the formation of horizontally separated bodies of heavily doped Si and sources by a self-aligned process and a lift-off process along with the formation of trenches having negatively-sloped side-walls.

8 Claims, 3 Drawing Sheets

METHOD OF PRODUCING VDMOS DEVICE OF INCREASED POWER DENSITY

BACKGROUND OF THE INVENTION

This invention relates to a method of producing a VDMOS (vertical double diffused metal-on-semiconductor) device particularly a power VDMOS device.

Power VDMOS devices are well known in the art. Thus such devices and method of their fabrication are described in Goodman et al. U.S. Pat. No. 4,587,713, Contiero et al. U.S. Pat. No. 4,774,198, Suzuki European Patent Application 0336393, Nakaqawa et al. U.S. Pat. No. 4,680,604 and other references described on pages 8 and 9 of application Ser. No. 07/842853 filed on Feb. 25, 1992 by the Applicant Manjin J. Kim and now U.S. Pat. No. 5,268,586 and the contents of which are hereby incorporated by reference.

Such devices are used, for example, as high current power switches and as rectifiers for high frequency power supplies.

For many purposes including reasons of economy it is useful that the density of the VDMOS devices provided on a semiconductor substrate be as high as possible.

A problem with increasing the density of the VDMOS devices as made according to these known methods is that the trench contact between the X doped source at the y doped body (where x is p or n and y is a dopant opposite to that of x) requires a large area. As a result the density of a VDMOS device that can be provided for a given semiconductor substrate area is severely limited.

This is true also for the device produced by method disclosed in the above-noted Applicants' U.S. Pat. No. 5,268,586.

SUMMARY OF THE INVENTION

A principal object of this invention is to provide a method for increasing the density of VDMOS device that may be fabricated on a semiconductor substrate.

This and other objects of the invention will be apparent from the description that follows:

Basically, the method of this invention involves source and body formation by use of a self-aligned process along with the use of a lift-off process and trenches having negatively-sloped side-walls.

More particularly, the method involves the following:

A first epi Si layer which is relatively lightly doped with a dopant of a first conductivity type is deposited on the surface of a semiconductor substrate which is relatively heavily doped with a dopant of this first conductivity type. A second Si layer which is relatively lightly doped with a second dopant of a type electrically opposing to that of the first dopant is then formed in the surface of the first Si layer by ion implantation and drive-in. A first thin Si oxide layer is then formed on the second Si layer.

A photoresist pattern which has negatively sloped trenches is formed in a manner so as to expose portions of the surface of the first Si oxide layer.

A dopant of the first conductivity type is implanted in the surface of the second Si layer located in the trenches to thereby form horizontally separated bodies of Si that are heavily doped with a dopant of the first conductivity type covered only by the first Si oxide layer.

A layer of a conductive metal having a thickness sufficient to mask the exposed portions of the first Si oxide layer from implantation of dopant ions as well as essentially all the surfaces of the photoresist pattern while leaving exposed only areas of the upper edges of the outer surfaces of the walls of these trenches is then deposited on the resultant structure. The photoresist pattern and the metal deposited thereon are then removed.

As a result of this lift-off there remains, on the first epi Si layer horizontally separated bodies of Si heavily doped with a dopant of the first conductivity type each of which is coated with portions of the first silicon oxide layer, which portions of silicon oxide are coated with portions of the layer of conductive metal.

Areas of Si which are heavily doped with a dopant of the second conductivity type by implementation and drive-in are then formed between the bodies of Si heavily doped with a dopant of the first conductivity type thereby forming source regions. This results in the formation of a high density of extremely small body contacts. The remaining portions of the layer of the conductive metal is then removed.

Following this, a thin layer of a nitride, particularly a silicon nitride, is deposited on the silicon oxide layer. A thick layer of LTO (low temperature silicon oxide) is then deposited on the nitride layer.

A new photoresist pattern is then formed on the LTO layer in a manner so as to expose only areas of this layer of LTO that cover only center areas of the horizontally separated bodies of Si that are heavily doped with the dopant of the first conductivity type.

Plasma etching is then employed to remove the exposed areas of this layer of LTO and all underlying portions of layers extending down to the first epi Si layer. As a result, trenches are formed between Si body contacts of Si heavily doped with a dopant of the second conductivity type while exposing portions of the first epi Si layer in the trenches.

After removal of this new photoresist pattern, the inner surfaces of the trenches are oxidized and poly Si heavily doped with a dopant of the first conductivity type is deposited into the trenches in the amount sufficient to fill the trenches to the surface of the layer of the LTO and outside the trenches on the layer of the LTO.

The layer of poly Si extending above the layer of the LTO is then removed thereby forming a planarized surface. As a result horizontally aligned poly Si gates are formed that are doped heavily with a dopant of the first conductivity type. The remaining portions of the layer of LTO are then removed by selective wet etching.

The poly Si gates are then capped by oxidizing the portions of the poly Si extending above the nitride layer.

A new LTO layer is then deposited on the poly Si gates and on the nitride layer.

By anisotropic plasma etching all of this new LTO poly layer is then removed except for that present on the edges of the Si gates extending above the nitride layer thereby forming oxide spacers extending from the edges of the poly Si gates to the nitride layer.

The nitride layer and the thin Si oxide layer underneath the nitride layer is then removed by wet isotropic etching without exposing the poly Si gates. As a result, only surfaces of Si extending between the poly Si gates are exposed.

A layer of conductive metal is then deposited on the resultant structure in order to form source contacts.

DETAILED DESCRIPTION OF THE INVENTION

Figure 1:
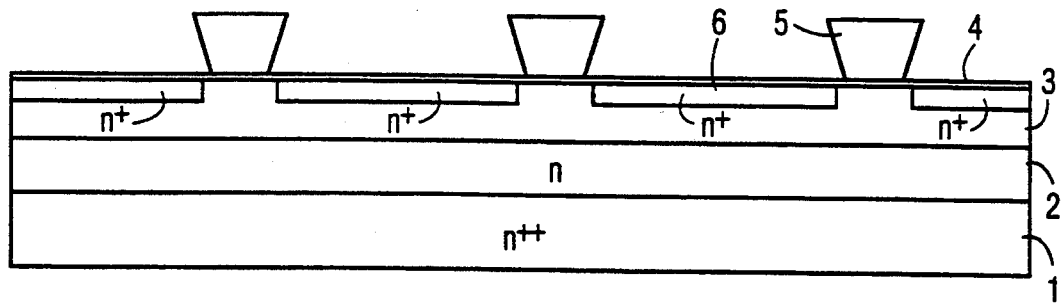
FIG. 1-9 of the drawing are cross-sectional views showing various steps of the method of the invention.

The invention will now be described in greater detail with reference to the following example and to the figures of the drawing.

Referring to FIG. 1, a very heavily n-doped silicon substrate 1 doped higher than $10^{19}$ cm$^{-3}$ with As has deposited on the surface thereof a-to-thick lightly n-doped epitaxy silicon layer 2 doped from $10^{15}$ to $3 \times 10^{16}$ cm$^{-3}$ with either arsenic or phosphorus. In this first epitaxy n-doped silicon layer 2 a lightly p-doped silicon implanted layer 3 of a thickness of 0.5 to 1.5$\mu$ is provided. This lightly p-doped silicon layer 3 is doped from $4 \times 10^{16}$ to $5 \times 10^{17}$ cm$^{-3}$ with boron.

A first thin silicon oxide layer 4 of a thickness of 300Å–1000Å is then provided on the surface of the first p-doped silicon layer 3.

A first photoresist pattern 5 having negatively sloped trenches is then formed on the surface of the first thin silicon oxide layer 4 in a manner so as to expose portions of the surface of the first thin silicon oxide layer 4 in these trenches using an image reversal process. An image reversal process such as described in Tobin et al, U.S. Pat. No. 4,771,017 or McFarland, U.S. Pat. No. 4,775,609 the contents of which are hereby incorporated by reference is used.

By implantation and drive-in with an n- type dopant such as As, P, or Sb, but preferably As, separated bodies 6 of heavily n-doped Si doped to a concentration of $10^{20} \sim 3 \times 10^{20}$ cm$^{-3}$ to a depth of 0.2~0.7$\mu$ are then formed in the surface of the p-doped Si layer 3.

Figure 2:
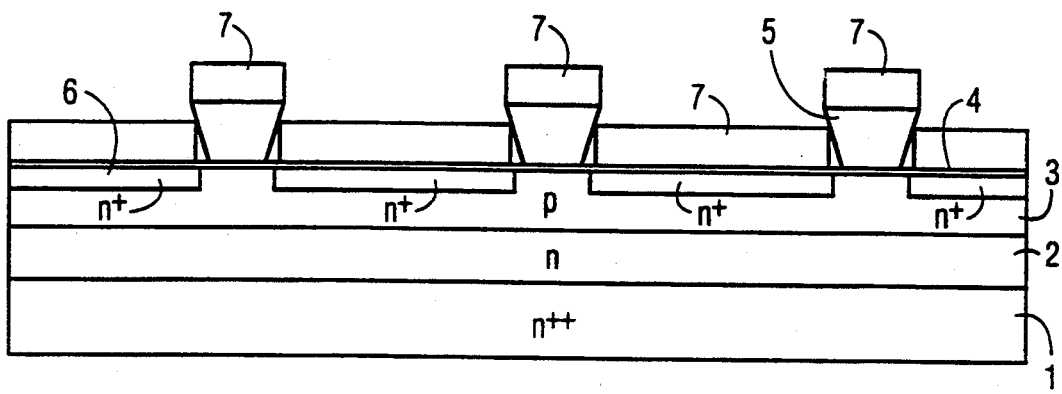

Then, as shown in FIG. 2, a layer 7 of a conductive metal (such as Mo) of a thickness sufficient to mask the exposed portions of the first thin silicon oxide layer 4 from implantation of dopant ions and essentially all the surfaces of the first photoresist pattern 5 is then deposited in a manner so as to leave exposed only upper areas of the walls of the trenches.

The first photoresist pattern 5 and the metal layer 7 deposited thereon are then removed by dissolving the photoresist pattern 5 by a solvent thereby causing the metal layer 7 deposited on the photoresist pattern 5 to "lift-off", leaving on those surfaces of the thin silicon oxide layer 4, under which there are present bodies of heavily n-doped silicon 6, portions of the layer 7 of conductive metal.

Figure 3:
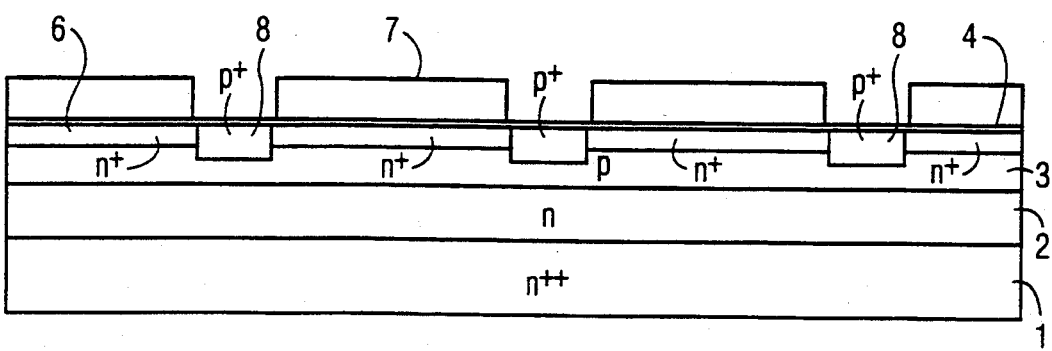

Separated areas of heavily p- doped silicon 8 are then provided between the areas of n-doped silicon 6 by boron implantation and drive-in. The doping concentration of the heavily p- doped silicon areas 8 is higher than $10^{19}$ cm$^{-3}$ to make good ohmic contact to the p- type body. The resultant structure is shown in FIG. 3.

The remaining portions of the first layer of conductive metal 7 are then removed. A thin layer of silicon nitride 9 of a thickness of 500Å–1500Å is then deposited by a CVD (chemical vapor deposition) process on the layer of silicon oxide 4. A first thick layer 10 of LTO (low temperature oxide) of a thickness of 7000Å–15000Å is then deposited on the nitride layer 9 by low temperature CVD.

A second photoresist pattern 11 is then provided on the surface of the first thick layer 10 of LTO in a manner so as to expose areas of the first thick layer 10 of LTO provided above the center areas of the n-doped silicon areas 6.

Figure 4:
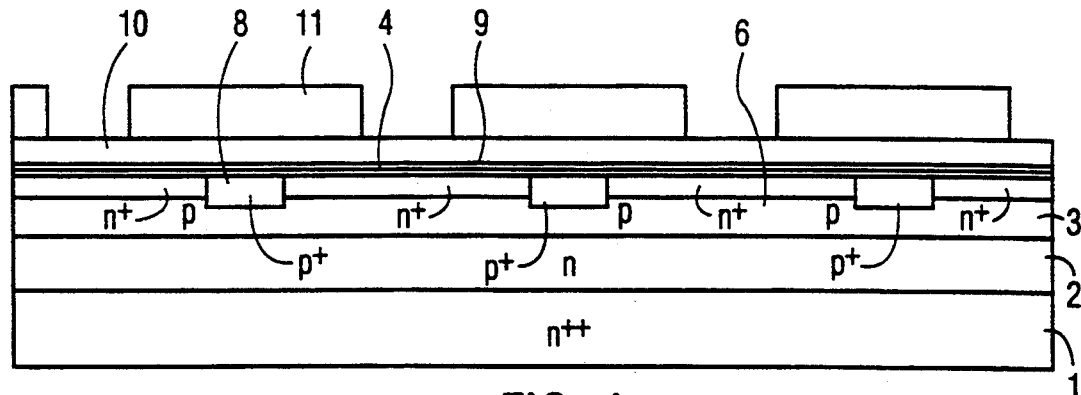
Figure 5:
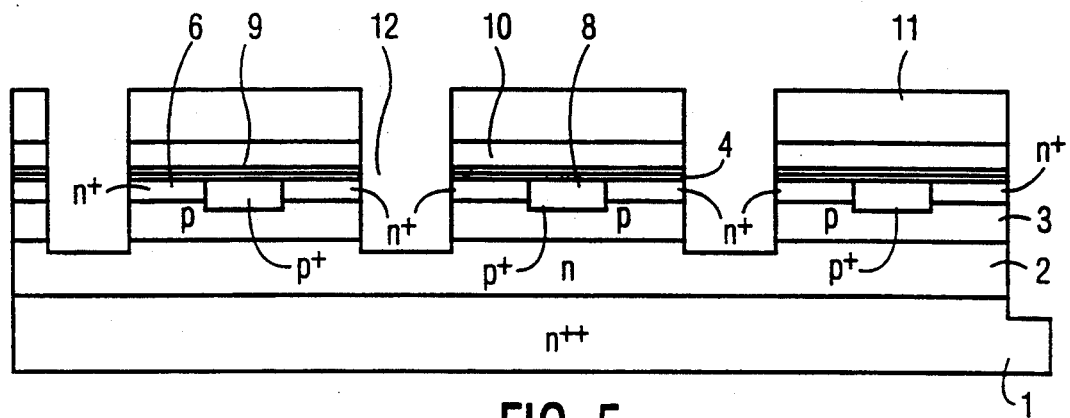

The resultant structure, shown in FIG. 4, is then subjected to reactive ion etching to remove portions of the first LTO layer 10 and all portions of underlying areas extending to the first epitaxy n-doped silicon layer 2 so as to form trenches 12 cutting through in the middle of the islands of n-doped silicon areas 6 thereby exposing portions of the lightly n-doped silicon layer 2 at the bottom of the trenches. The resulting structure is shown in FIG. 5.

The remaining portions of the photoresist pattern 11 are then removed by use of a solvent therefore and thereafter ashing in oxygen plasma.

Figure 6:
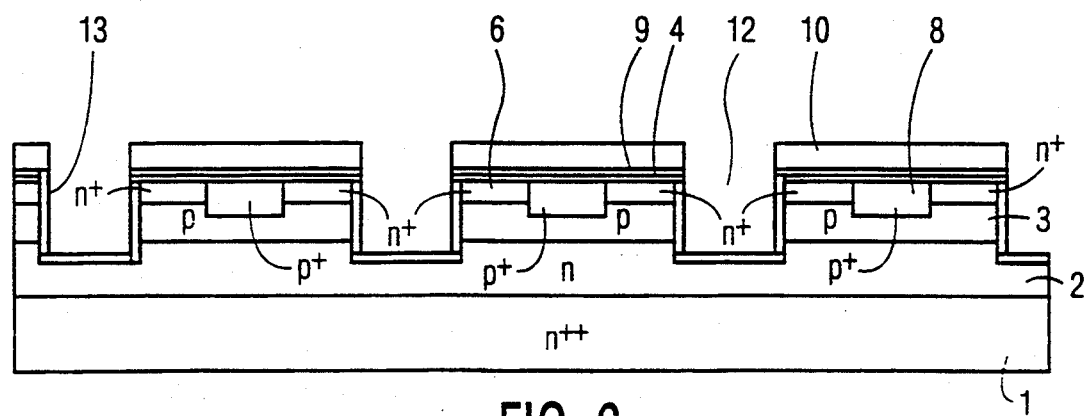

By a thermal oxidation the walls of the trenches 12 are then oxidized to form silicon gate oxide 13 resulting in the structure shown in FIG. 6.

Heavy -n doped poly Si is then deposited in the trenches 12 and on the surface of the thick layer of LTO 10. A sufficient amount of the poly Si is deposited in the trenches so as to fill completely the trenches up to the surface of the thick layer of LTO 10.

Figure 7:
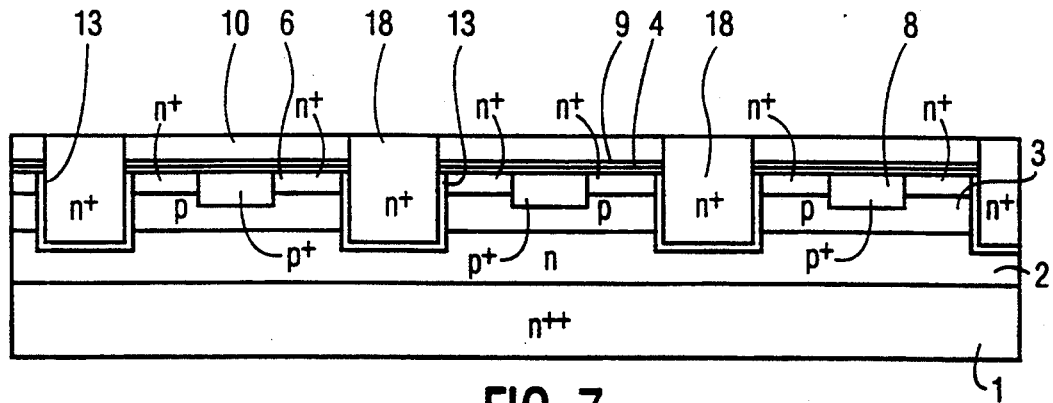

The portions of the n-doped poly Si extending above the thick layer of LTO 10 is then removed thereby forming a planarized surface. As a result, horizontally aligned poly Si gates 18 are formed, thus forming the structure of FIG. 7.

By isotropic wet etching the remaining portions of the thick layer of LTO 10 are removed. As a result the surface of the nitride layer 9 is exposed. The portions of the n-doped poly Si gates 18 extending above the nitride layer 9 are then oxidized to form Si oxide capping layer 19 capping the poly Si gates 18.

Figure 8:
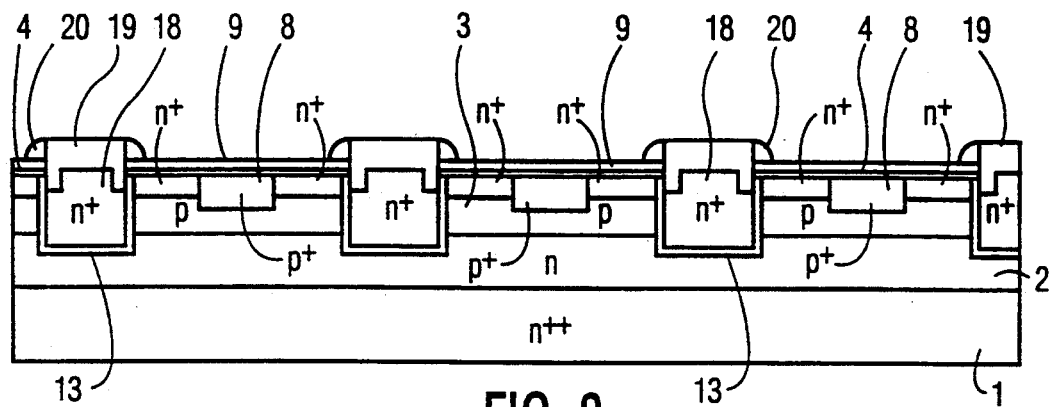

A second thick LTO layer of a thickness of 0.3–7$\mu$ is deposited on the nitride layer 9 and on the Si oxide layer 4. By anisotropic RIE etching the second LTO layer is removed from the nitride layer 9 and from the capped poly Si gates except for the outer edges of the capped Si gates 18 extending above the nitride layer 9. As a result oxide spacers 20 extending from the capped Si gates to the nitride layer 9 are formed. This anisotropic RIE etching is carried out with CHF$_3$ and Ar, for example, according to a procedure as described in Van der Putten, U.S. Pat. No. 5,017,516, the contents of which are hereby incorporated by reference. The resultant structure is shown in FIG. 8.

By wet isotropic etching with hot phosphoric acid the thin nitride layer 9 is first removed followed by the removal of the thin silicon oxide layer 4 by short HF dipping leaving exposed surfaces of the Si extending between the capped poly Si gates. By controlling the etching time, the thin nitride layer 9 and oxide layer 4 under the oxide spacers 20 can be preserved to prevent a void under the spacers.

Figure 9:
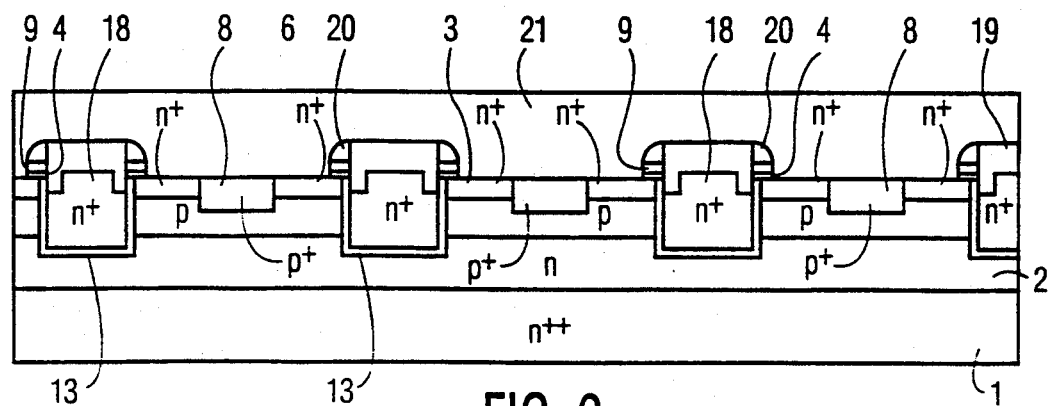

A layer of a conductive metal 21 such as Al is then deposited on the surface of the resultant structure to form a source contact. The resultant structure is shown in FIG. 9.

Due to the presence of the oxide spacers, shorts are prevented between the metal of the source contact and the polysilicon of the gates.

In addition, since the gates are self-aligned to the source contact, the process is relatively simple thereby resulting in high yield and cheaper products.

What is claimed is:

1. A method of producing a vertical DMOS device comprising the steps:

a) providing on an n++ doped semiconductor substrate a first epitaxy n-doped Si layer and providing in the surface of said first n-doped Si layer a first p-doped Si layer,
b) forming a first thin Si oxide layer on said first p-doped Si layer,
c) forming a first photoresist pattern wherein portions of the surface of said first thin Si oxide layer are exposed in negatively sloped trenches of said first photoresist pattern,
d) forming, in said trenches source regions of horizontally separated bodies of n+doped Si in the surface of said p-doped Si layer covered only by said first Si oxide layer,
e) depositing a first layer of a conductive metal of a thickness so as to cover the exposed portions of said first thin Si oxide layer and essentially all of the sidewall surfaces of said first photoresist pattern while leaving exposed only the areas of the upper edges of the sidewall surfaces of said trenches,
f) removing said first photoresist pattern and metal deposited thereon thereby leaving remaining on said first Si oxide layer, horizontally separated metal portions, over said bodies of n+doped Si, each body having on a surface said layer of said metal portions contacting the surface of a portion of said first Si oxide layer contacting only the surface of said horizontally separated bodies of n+ doped Si,
g) providing areas of p+doped Si between said bodies of n+doped Si,
h) removing said remaining portions of said first layer of conductive metal,
i) depositing a thin layer of nitride on said first thin Si oxide layer and a first thick layer of low temperature oxide, LTO, on said nitride layer,
j) forming a second photoresist pattern on said first layer of LTO so as to expose only areas of said first layer of LTO provided above the center areas of said bodies of n+doped Si,
k) removing by plasma etching exposed portions of said first layer of LTO and all portions of underlying layers extending to said first epitaxy n-doped Si layer so as to form first trenches between said source regions of n+doped Si thereby exposing portions of said first epitaxy n-doped Si layer in said trenches,
l) removing said second photoresist pattern,
m) oxidizing the inner surfaces of said first trenches,
n) depositing n+doped poly Si in said first trenches and on the surface of said thick layer of LTO, so as to fill up said first trenches,
o) removing essentially all of said n+doped poly Si extending above said thick layer of LTO thereby forming horizontally aligned n+doped poly Si gates,
p) removing remaining portions of said first thick layer of LTO,
q) oxidizing the portions of said n+doped poly Si extending above said nitride layer to thereby cap said poly Si gates,
r) depositing a second thick LTO layer on said capped poly Si gates and said nitride layer,
s) removing by anisotropic plasma etching, said second LTO layer from said nitride layer and from said capped poly gates except from the sidewall surfaces of said capped bodies extending above said nitride layer,
t) removing, by wet isotropic etching, said nitride layer and said first Si oxide layer underneath said nitride layer thereby exposing surfaces of Si extending between said capped poly gates,
u) depositing a layer of conductive metal on the surface of the resultant structure to form source contacts.

2. A method of producing a vertical DMOS semiconductor device said method comprising the steps:
a) providing on a semiconductor substrate very heavily doped with a dopant of a first conductivity type a first epitaxial, epi, Si layer lightly doped with a dopant of said first conductivity type and providing in said first Si layer a second Si layer moderately doped with a dopant of a second, electrically opposing, conductivity type,
b) forming a first, thin, Si oxide layer on said second Si layer,
c) forming a photoresist pattern having negatively sloped first trenches in which portions of the surface of said first Si oxide layer are exposed,
d) forming, in said first photoresist trenches source regions of separated horizontally separated first bodies of Si heavily doped with a dopant of said first conductivity type in the surface of said second, moderately doped Si layer covered only by said first Si oxide layer,
e) depositing a first layer of a conductive metal of a thickness so as to cover the exposed portions of said first Si oxide layer and essentially all of the sidewall surfaces of said first photoresist pattern while leaving exposed only the upper areas of the upper edges of the sidewall surfaces of said first trenches,
f) removing said first photoresist pattern and metal deposited thereon thereby leaving remaining on said first Si oxide layer horizontally separated metal bodies, each of said metal bodies contacting a surface of a portion of said first Si oxide layer contacting only the surface of one of said horizontally separated first bodies of Si heavily doped with a dopant of the first conductivity type,
g) providing second bodies of Si heavily doped with a dopant of said second conductivity type between said source regions of said first horizontally separate bodies of Si heavily doped with a dopant of said first conductivity type,
h) removing said metal bodies,
i) depositing a thin layer of a metal nitride on said first Si oxide layer,
j) depositing a first thick layer of low temperture oxide, LTO, on said metal nitride layer,
k) forming a second photoresist pattern on said first layer of LTO so as to expose only areas of said first thick layer of LTO provided above said horizontally separated first bodies of Si,
l) removing, by plasma etching, said exposed areas of said first thick layer of LTO and all portions of layers underlying said exposed areas extending to said first epi Si layer so as to form second trenches between said source regions of said first bodies of heavily doped Si thereby exposing portions of said first epi lightly doped Si layer within said trenches,
m) removing said second photoresist pattern,
n) oxidizing the inner surfaces of the walls of said second trenches,
o) depositing poly Si heavily doped with a dopant of said first conductivity type in said second trenches, so as to fill up said second trenches, and on said first thick layer of LTO, p) removing essentially all of said poly Si extending above said first layer of LTO thereby forming horizontally aligned poly Si gates, q) removing remaining portions of said first layer of LTO by anisotropic ion etching, r) oxidizing the portions of said poly Si extending above said nitride layer to thereby cap said poly Si gates, s) depositing a second thick LTO layer on said capped poly Si gates and on said nitride layer, t) removing, by anisotropic plasma etching, said second thick LTO layer from said nitride layer and from said capped poly Si gates except for the surfaces of said capped Si gates extending above said nitride layer, thereby providing oxide spacers extending from the edges of the Si gates to the nitride layer, u) removing, by wet isotropic etching, said nitride layer and said first Si oxide layer underneath said nitride layer thereby exposing surfaces of Si extending between said capped poly Si gates, v) depositing a layer of conductive metal on the surface of said resultant structure to form source contacts.

3. The method of claim 1, wherein the first p-doped Si layer is provided in the first n-doped Si layer by boron implantation.

4. The method of claim 3, wherein the plasma etching carried out in step "k" is reactive ion etching.

5. The method of claim 4, wherein the plasma etching carried out in step "s" is reactive ion etching.

6. The method of claim 1, wherein the bodies of n+doped Si are formed by implantation and drive in of an n-type dopant selected from the group consisting of As, P and Sb in the surface of the portions of the p-doped Si layer present in the trenches formed by the first photoresist pattern.

7. The method of claim 6 wherein the concentration of dopant in the bodies of n+doped Si is $10^{20} - 3 \times 10^{20}$ cm$^{-3}$.

8. The method of claim 6 wherein the source regions of p+doped Si is doped to a dopant concentration greater than $10^{19}$ cm$^{-3}$ by implantation and drive in of boron.

* * * * *